United States Patent
Kitano

(10) Patent No.: US 9,252,173 B2
(45) Date of Patent: Feb. 2, 2016

(54) SOLID-STATE IMAGING DEVICE AND MANUFACTURING METHOD OF THE SAME, AND IMAGING UNIT

(75) Inventor: Yoshiaki Kitano, Kumamoto (JP)

(73) Assignee: Sony Corporation, Tokyo (JP)

( * ) Notice: Subject to any disclaimer, the term of this patent is extended or adjusted under 35 U.S.C. 154(b) by 162 days.

(21) Appl. No.: 13/604,155

(22) Filed: Sep. 5, 2012

(65) Prior Publication Data

US 2013/0088713 A1  Apr. 11, 2013

(30) Foreign Application Priority Data

Oct. 7, 2011  (JP) ................. 2011-222743

(51) Int. Cl.
*H01L 27/146*  (2006.01)
*H01L 27/148*  (2006.01)

(52) U.S. Cl.
CPC .... *H01L 27/14623* (2013.01); *H01L 27/14685* (2013.01); *H01L 27/14687* (2013.01); *H01L 27/14818* (2013.01); *H01L 27/14843* (2013.01)

(58) Field of Classification Search
USPC .......... 257/432, 435, 291, 292, 231, E27.133; 438/311, 75
See application file for complete search history.

(56) References Cited

U.S. PATENT DOCUMENTS

| | | | | |
|---|---|---|---|---|
| 5,448,097 | A * | 9/1995 | Mizushima et al. | 257/435 |
| 5,463,232 | A * | 10/1995 | Yamashita et al. | 257/223 |
| 5,514,888 | A * | 5/1996 | Sano et al. | 257/232 |
| 5,643,232 | A * | 7/1997 | Villotti, Jr. | 604/292 |
| 6,414,343 | B1 * | 7/2002 | Kondo et al. | 257/294 |
| 7,385,270 | B2 * | 6/2008 | Ihara | 257/435 |
| 7,830,433 | B2 * | 11/2010 | Fujioka et al. | 348/294 |
| 7,914,953 | B2 * | 3/2011 | Shimizu et al. | 430/5 |
| 8,017,984 | B2 * | 9/2011 | Kitano et al. | 257/294 |
| 8,143,117 | B2 * | 3/2012 | Sun et al. | 438/164 |
| 8,593,554 | B2 * | 11/2013 | Miyazawa et al. | 348/311 |
| 2002/0021378 | A1 * | 2/2002 | Murade | 349/43 |
| 2002/0057403 | A1 * | 5/2002 | Yasukawa et al. | 349/110 |
| 2002/0186192 | A1 * | 12/2002 | Maruoka et al. | 345/87 |
| 2006/0170009 | A1 * | 8/2006 | Kitano et al. | 257/236 |
| 2007/0145427 | A1 * | 6/2007 | Arimoto et al. | 257/239 |
| 2007/0159563 | A1 * | 7/2007 | Moriwaki | 349/38 |
| 2009/0230437 | A1 * | 9/2009 | Kawahito et al. | 257/226 |
| 2009/0302408 | A1 * | 12/2009 | Nakagawa et al. | 257/432 |
| 2010/0097512 | A1 * | 4/2010 | Miyazawa et al. | 348/311 |
| 2011/0316109 | A1 * | 12/2011 | Asano et al. | 257/435 |

FOREIGN PATENT DOCUMENTS

JP  2009-252840  10/2009

* cited by examiner

*Primary Examiner* — Sang Nguyen

(74) *Attorney, Agent, or Firm* — Michael Best & Friedrich LLP

(57) ABSTRACT

A solid-state imaging device includes a light sensing unit generating a signal charge by performing a photoelectric conversion of an incident light; a conductive material in the vicinity of the light sensing unit; a first light-shielding film formed to cover at least a portion of the conductive material; and a second light-shielding film formed on a part of or all of a surface of the first light-shielding film.

20 Claims, 6 Drawing Sheets

SOLID-STATE IMAGING DEVICE AND MANUFACTURING METHOD OF THE SAME, AND IMAGING UNIT

BACKGROUND

The present technology relates to a solid-state imaging device and a manufacturing method thereof, and an imaging unit, in particular, relates to a solid-state imaging device in which the opening of the pixel is able to further widen, and a manufacturing method thereof, and an imaging unit.

In recent years, miniaturization of imaging devices such as a charge coupled devices (CCD) has been progressing. Along with this, focusing properties such as sensitivity or smear noise of the imaging device have become highly dependent on the opening size of pixels which is determined by the shape of a light-shielding film or the like in the vicinity of each pixel.

Therefore, by setting the wiring structure to commonalize a transfer electrode and a light-shielding film to be used to transfer a charge accumulated in each pixel, a technology for widening the opening size of each pixel has been proposed (for example, refer to Japanese Unexamined Patent Application Publication No. 2009-252840)

In this technology, an insulation film is deposited in order to cover the transfer electrode provided on a substrate of the imaging device, the insulation film formed on an upper surface portion of the transfer electrode is removed and a contact is formed on the transfer electrode. Further, the light-shielding film is deposited in order to cover the contact and the insulation film, the light-shielding film also functions as a signal line to apply a voltage to the transfer electrode and shields unnecessary light which is incident toward the inside of the substrate. That is, since the light-shielding film and the transfer electrode are electrically connected to each other through the contact, the voltage may be applied to the transfer electrode.

SUMMARY

However, in the technology described above, the opening of each pixel of the imaging device has been unable to be made sufficiently wide.

For example, in the technology to commonalize the transfer electrode and the light-shielding film, due to limitations on the thickness of the insulation film or the contact size which are provided with respect to the transfer electrode, it has been difficult to make the opening width of each pixel wide enough. Further, since contact is to be provided between the transfer electrode and the light-shielding film, the height of the direction perpendicular to the light receiving surface of the substrate in a portion of the transfer electrode becomes higher and therefore, the opening of the pixel becomes narrowed.

It is desirable to consider that the present technology make the opening of the pixel wider.

A solid-state imaging device according to a first embodiment of the present technology includes a light sensing unit which generates a signal charge by performing a photoelectric conversion of an incident light, a conductive material in the vicinity of the light sensing unit, a first light-shielding film formed to cover at least a portion of the conductive material, a second light-shielding film formed on a part of or all of the surface of the first light-shielding film.

As a member having conductivity such as the first light-shielding film and the second light-shielding film, the voltage may be applied to the conductive material via the first light-shielding film and second light-shielding film when the solid-state imaging device is driven.

The conductive material may be the transfer electrode to which the voltage is applied when the signal charge accumulated in the light sensing unit is readout.

With respect to the width in the direction of being lined up between the conductive material and the light sensing unit which is in the vicinity of the conductive material, the second light-shielding film is formed to be narrower than the width of the direction of the first light-shielding film.

The second light-shielding film may be formed in the shape of a sidewall on the side of the light sensing unit side of the first light-shielding film.

The conductive material may be formed from a polysilicon and the first light-shielding film and the second light-shielding film may be formed from tungsten.

A manufacturing method according to a first embodiment of the present technology includes: forming a first light-shielding film covering at least a portion of the conductive material arranged in the vicinity of the light sensing unit which generates the signal charge by performing photoelectric conversion on the incident light, and forming a second light-shielding film on a part of or all of the surface of the first light-shielding film.

A first light-shielding film may be formed to cover at least a portion of conductive material arranged in the vicinity of the light sensing unit which generates the signal charge by performing photoelectric conversion on the incident light, and the second light-shielding film may be formed on a part of or all of the surface of the first light-shielding film.

An imaging unit according to a second embodiment of the present technology including: a light sensing unit generating a signal charge by performing photoelectric conversion on the incident light from a subject, an optical system guiding light from the subject to the light sensing unit; a conductive material in the vicinity of the light sensing unit, a first light-shielding film formed to cover at least a portion of the conductive material; and a second light-shielding film formed on a part of or all of the surface of a first light-shielding film.

A first light-shielding film may be formed to cover at least a portion of the conductive material which is arranged in the vicinity of the light sensing unit which generates the signal charge by performing photoelectric conversion on incident light from the subject, and the second light-shielding film is formed on the part of or all of the surface of the first light-shielding film.

According to the first embodiments and the second embodiment of the present technology, an opening of a pixel may be made wider.

DETAILED DESCRIPTION OF EMBODIMENTS

Hereinafter, the embodiments of the present technology will be illustrated with reference to the drawings.

First Embodiment

Configuration Example of Imaging Apparatus

Figure 1:
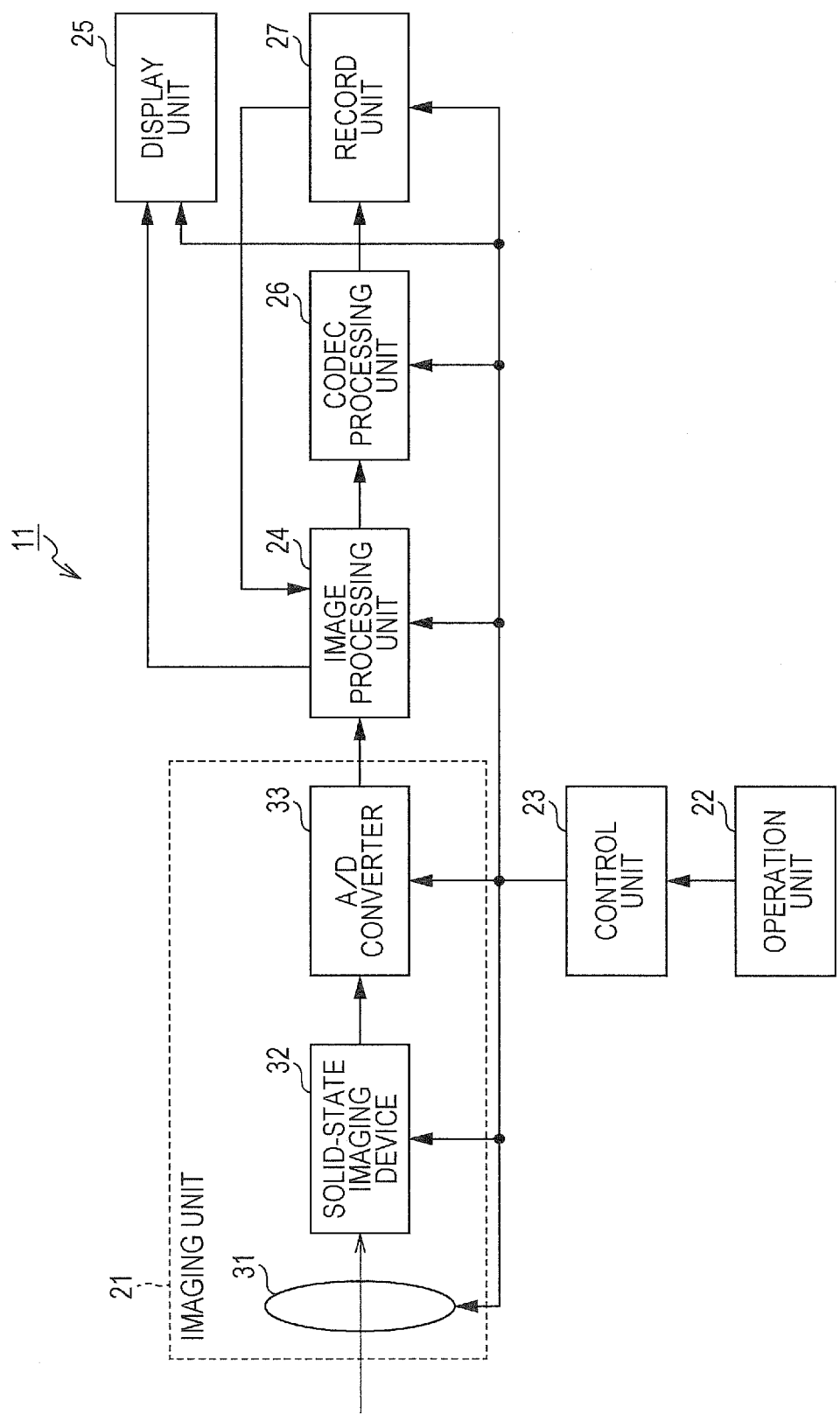
FIG. 1 is a diagram illustrating a configuration example of an imaging apparatus to which the present technology is applied.

FIG. 1 is a diagram illustrating a configuration example of an embodiment of an imaging apparatus to which the present technology is applied.

An imaging apparatus 11 includes an imaging unit 21, an operation unit 22, a control unit 23, an image processing unit 24, a display unit 25, a codec processing unit 26, and a record unit 27.

The imaging unit 21 is a unit that generates an image by capturing an image of the subject, including a lens unit 31, a solid-state imaging device 32, and an A/D (Analog/Digital) converter 33.

The lens unit 31 formed of an optical imaging system such as a lens is driven according to the control of the control unit 23, performs focus adjustment and guides the light from the subject to the solid-state imaging device 32. The solid-state imaging device 32 formed of, for example, CCD sensor or the like performs photoelectric conversion of a light from the lens unit 31 and supplies the A/D converter 33 with a voltage signal corresponding to intensity of the received light, where the voltage signal is obtained for each pixel configuring the solid-state imaging device 32.

The A/D converter 33 converts the voltage signal of pixel supplied from the solid-state imaging device 32 into a digital image signal (hereinafter, also referred to as a pixel signal), which is sequentially supplied to the image processing unit 24.

The operation unit 22 formed of, for example, a button or a touch panel or the like receives an user's operation input and supplies the control unit 23 with a signal corresponding to the operation input thereof. The control unit 23 controls the lens unit 31, the solid-state imaging device 32, the A/D converter 33, the image processing unit 24, the display unit 25, the codec processing unit 26 and the record unit 27 based on a signal corresponding to an user's operation input supplied from the operation unit 22.

With respect to the image signal supplied from A/D converter 33, the image processing unit 24 performs various image processes such as, for example, white balance adjustment or demosaicing, and supplies the result thereof to the display unit 25 and the codec processing unit 26 thereafter.

The display unit 25 formed of, for example, a liquid crystal display, displays the image of the subject based on the image signal supplied from the image processing unit 24. The codec processing unit 26 performs an encoding process on the image signal from the image processing unit 24, and supplies the image data record unit 27 with the image data obtained as a result thereof.

The record unit 27 records the image data supplied from the codec processing unit 26. The image data recorded in the record unit 27 is readout to the image processing unit 24 as necessary and is supplied to the display unit 25, on which the corresponding image is displayed.

Configuration Example of Solid-State Imaging Device

Figure 2:
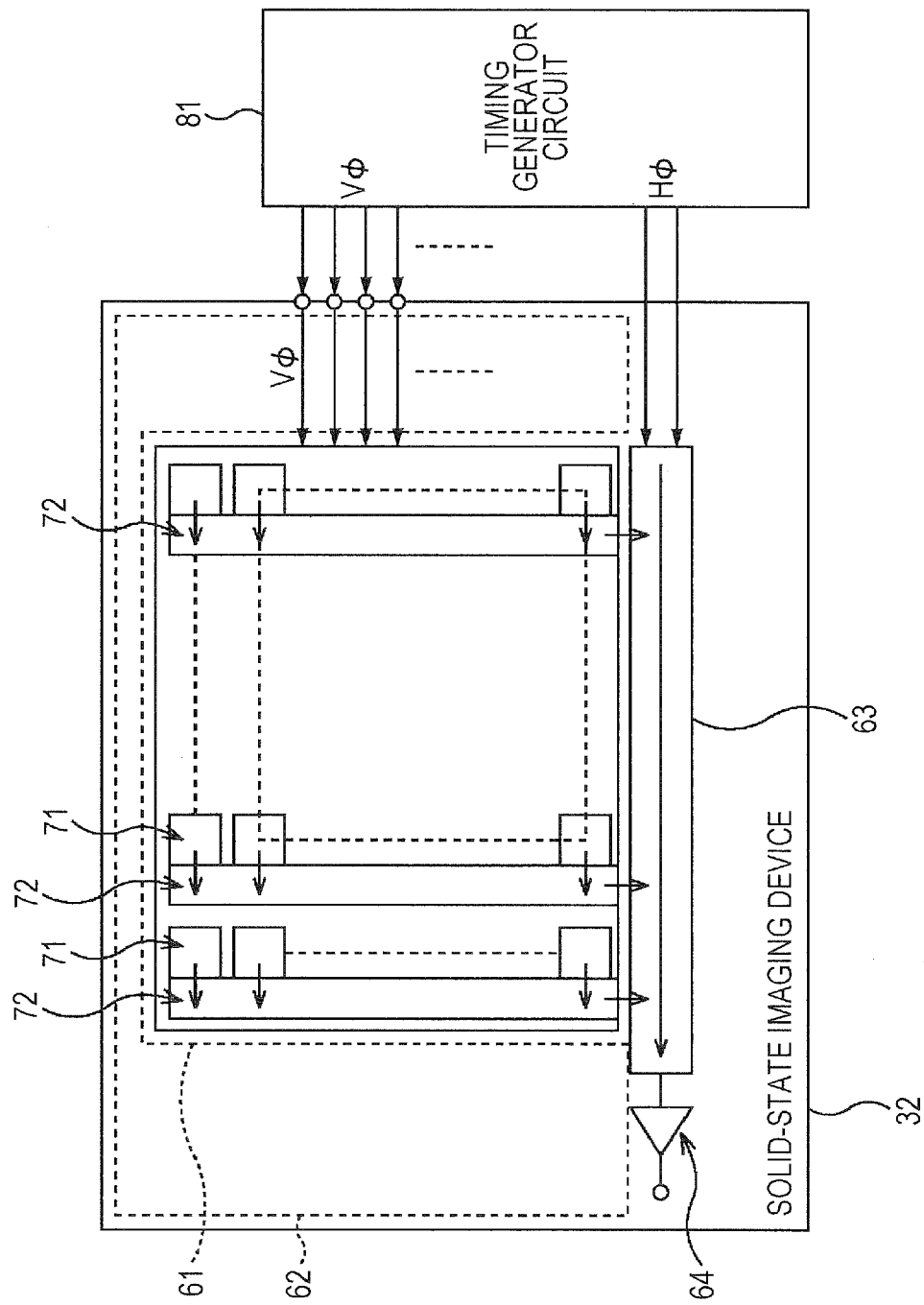
FIG. 2 is a diagram illustrating a configuration example of a solid-state imaging device.

Further, solid-state imaging device 32 of FIG. 1 is configured, for example, as illustrated in FIG. 2.

That is, the solid-state imaging device 32 is configured of an imaging unit 61 on which the light from the subject is incident, an optical black region 62 provided so as to surround the imaging unit 61, a horizontal transfer unit 63 and output unit 64.

The imaging unit 61 arranged in the shape of matrix includes a light sensing unit 71 configuring a pixel; and a vertical transfer unit 72 that transfers charge from the light sensing unit 71 in vertical direction, which is arrayed in the longitudinal direction (hereinafter, also referred to as vertical direction) in the figure.

Further, in FIG. 2, one rectangle represents one light sensing unit 71, for illustration purpose, a sign is given only to a part of the light sensing unit 71. The light sensing unit 71 accumulates the charge obtained as a result thereof and performs photoelectric conversion on the incident light and transfers charge to the vertical transfer unit 72.

Further, in the figure, there are a plurality of vertical transfer units 72 provided in line in a traverse direction (hereinafter, also referred to as the horizontal direction) in the imaging unit 61, the vertical transfer unit 72 transfers the charge from the light sensing unit 71 in the vertical direction, and supplies the charge to the horizontal transfer unit 63.

More specifically, the vertical transfer unit 72 is configured of a charge transfer channel region which transfers charge and a transfer electrode which applies a voltage to the charge transfer channel region since a vertical transfer clock $V\phi$ is applied from a timing generator circuit 81. A transfer of charge to the vertical direction in the charge transfer channel region is performed when the vertical transfer clock $V\phi$ having a predetermined size is applied to the transfer electrode.

Further, when a horizontal transfer clock $H\phi$ is applied to the horizontal transfer unit 63, using the timing generator circuit 81, the horizontal transfer unit 63 transfers the charge which has been transferred from the vertical transfer unit 72 in the horizontal direction. And, the charge which has been transferred to the horizontal transfer unit 63 is converted into a voltage at a floating diffusion unit which is not illustrated and the voltage signal which has been obtained by conversion from the output unit 64 is outputted to the A/D converter 33 in FIG. 1.

Configuration Example of Each Pixel

Figure 3:
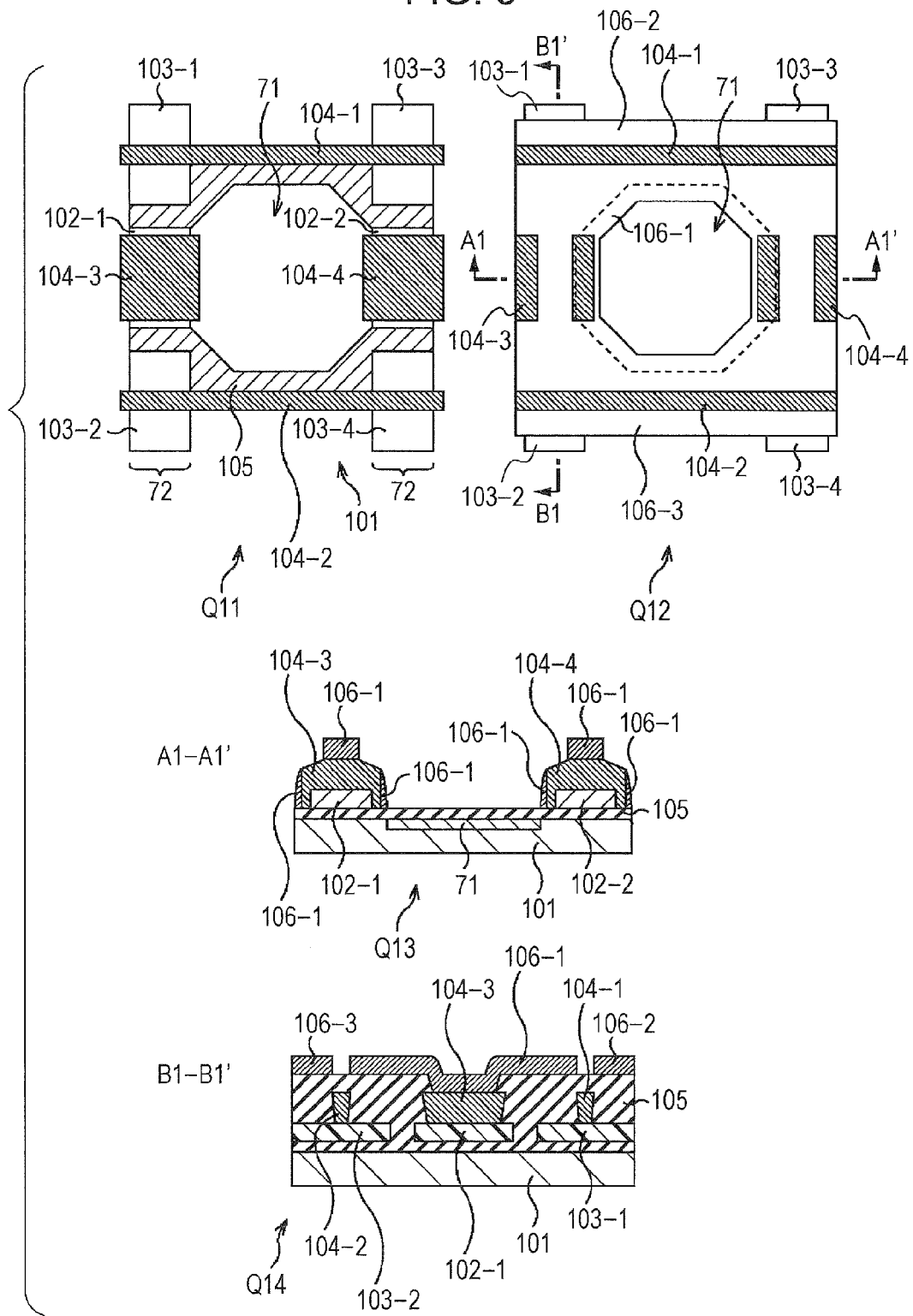
FIG. 3 is a diagram illustrating a more specific configuration example of each pixel of the solid-state imaging device.

In addition, the vicinity of the light sensing unit 71 which configures each pixel of the solid-state imaging device 32 is configured as illustrated in FIG. 3, for example.

That is, as indicated by the arrow Q11, the light sensing unit 71 is formed inside a substrate 101 configuring the solid-state imaging device 32. For example, the substrate 101 is formed of a Si substrate or the like. Further, in the solid-state imaging device 32 as indicated by the arrow Q11, the longitudinal direction is the vertical direction in the figure, and the traverse direction is the horizontal direction.

Further, in the figure of a light sensing unit 71, on the left side, a first transfer electrode 102-1 is provided on the substrate 101. In the figure of the first transfer electrode 102-1, a second transfer electrode 103-1 and a second transfer electrode 103-2 are respectively provided up and down.

In the same manner, in the figure of the light sensing unit 71, on the right side, a first transfer electrode 102-2 is provided on the substrate 101. In the figure of the first transfer electrode 102-2, a second transfer electrode 103-3 and the second transfer electrode 103-4 are respectively provided up and down.

In the example in FIG. 3, a vertical transfer unit 72 is configured of the second transfer electrode 103-1, the first transfer electrode 102-1 and a second transfer electrode 103-2 which are lined up in longitudinal direction, where the arranged direction is vertical direction in the figure. Further, a vertical transfer unit 72 is also composed of the second transfer electrode 103-3, the first transfer electrode 102-2 and the second transfer electrode 103-4 which are lined up in the longitudinal direction, where lined-up direction is the vertical direction in the figure.

Further, hereinafter, in a case where there is no particular reason to distinguish the first transfer electrode 102-1 and the first transfer electrode 102-2, they are also referred to simply as the first transfer electrode 102 and, in a case where there is no particular reason to distinguish the second transfer electrode 103-1 to the second transfer electrode 103-4, these are referred to simply as the second transfer electrode 103.

Further, each of second transfer electrodes 103 which is arranged in the horizontal direction is electrically connected by a first light-shielding film. That is, the second transfer electrode 103-1 and the second transfer electrode 103-3 which are arranged in the traverse direction are connected by the first light-shielding film 104-1, the second transfer electrode 103-2 and the second transfer electrode 103-4 which are arranged in the horizontal direction in the drawing are connected by the first light-shielding film 104-2 in the figure.

Further, a first light-shielding film 104-3 is provided on the upper surface of the first transfer electrode 102-1, while the first light-shielding film 104-4 is provided on the upper surface of the first transfer electrode 102-2. Further, hereinafter, in a case where there is no particular reason to distinguish the first light-shielding film 104-1 to the first light-shielding film 104-4, they are also referred to simply as the first light-shielding film 104.

Each first light-shielding film 104 formed of a material such as a metal having conductivity also functions as a signal line which applies a voltage to the first transfer electrode 102 or the second transfer electrode 103, while shielding unnecessary light which is incident on the substrate 101. These first light-shielding films 104 are provided on the front side in the figure of the first transfer electrode 102 or the second transfer electrode 103, that is, provided on the surface of a portion of the side which is opposite to the substrate 101 side in the first transfer electrode 102 or the second transfer electrode 103.

In addition, on the substrate 101, there is provided an insulation film 105 such as an $SiO_2$ in order for the insulation of the first transfer electrode 102, the second transfer electrode 103 or the first light-shielding film 104.

Further, more specifically, at the upper portion of the first light-shielding film 104 or the insulation film 105 on the substrate 101, as indicated by the arrow Q12, the second light-shielding film 106-1 to the second light-shielding film 106-3 are provided. Further, in the solid-state imaging device 32 as indicated by the arrow Q12, the longitudinal direction is the vertical direction in the figure while the traverse direction is the horizontal direction in the figure.

In this example, the second light-shielding film 106-1 is provided between the first light-shielding film 104-1 and the first light-shielding film 104-2 and, in the second light-shielding film 106-1, the region in the vicinity of light sensing unit 71 is open. Further, in the figure of the first light-shielding film 104-1, the second light-shielding film 106-2 is provided on the upper side and in the figure of the first light-shielding film 104-2, the second light-shielding film 106-3 is provided on the lower side.

The second light-shielding film 106-1 to second light-shielding film 106-3 are in an electrically separated state, that is, in an electrically disconnected state. Further, hereinafter, in a case where it is not particularly necessary to distinguish the second light-shielding film 106-1 to the second light-shielding film 106-3, they are also referred to simply as a second light-shielding film 106.

Each second light-shielding film 106 formed of a material such as a metal having conductivity shields unnecessary light which is incident on the substrate 101. Further, each second light-shielding film 106-1 also functions as a signal line which applies a voltage to the first transfer electrode 102 while electrically connected to the first transfer electrode 102 via the first light-shielding film 104.

Since the first light-shielding film 104 and the second light-shielding film 106 also function as a light-shielding member and signal line, preferably, the material of which may be a conductive metal having shielding ability, for example, tungsten or the like. Further, between the first transfer electrode 102 and the first light-shielding film 104, or between the second transfer electrode 103 and the first light-shielding film 104, preferably, barrier metals such as Ti (titanium), TiN (titanium nitride) may be provided as necessary.

Further, in the solid-state imaging device 32 as indicated by the arrow Q12, the cross-section of the central portion, that is, the cross-section A1-A1', for example, is as indicated by the arrow Q13. In the cross-section as indicated by the arrow Q13, the traverse direction is set to be the horizontal direction in the figure while the depth direction is the vertical direction in the figure.

In the example indicated by the arrow Q13, the light sensing unit 71 is provided in the vicinity of the surface of central portion of substrate 101, in the figure of the substrate 101, on the upper side, that is, on the surface, the insulation film 105 is formed. Further, in the figure of the insulation film 105, on the upper side, the first transfer electrode 102 is provided and, the first light-shielding film 104 is provided to cover the first transfer electrode 102, in addition, the second light-shielding film 106 is provided to cover a portion of the surface of the first light-shielding film 104.

In particular, in the figure of light sensing unit 71, the first transfer electrode 102-1 and the first transfer electrode 102-2 are provided on the left and right sides. The portion from the first transfer electrode 102-1 to the first transfer electrode 102-2 is the opening portion of pixel including the light sensing unit 71.

In the cross-section of the pixel portion in the horizontal direction (A1-A1' cross-section), the first light-shielding film 104 is formed directly on the surface of the first transfer electrode 102, where the width of the first light-shielding film 104 in the longitudinal direction (vertical direction) is only 10 to 100 nm wider at one side with respect to the first transfer electrode 102.

Further, in the figure of the first light-shielding film 104, the second light-shielding film 106 is provided on the upper side, and the width of which in the traverse direction (horizontal direction) is formed to be narrower than the first light-shielding film 104 in the figure. The upper surface of the first light-shielding film 104 in the figure is exposed by the amount of the width without being covered by the second light-shielding film 106.

In the figure of the first light-shielding film 104, on the left and right sides, the second light-shielding film 106 is provided to cover the sides thereof. That is, the second light-shielding film 106 is formed to remain in the shape of side wall at the lateral side of the first light-shielding film 104.

In addition, in the solid-state imaging device 32 as indicated by the arrow Q12, the cross-section of the central portion of vertical transfer unit 72, that is, the cross-section B1-B1', for example, is as indicated by the arrow Q14. In the cross-section as indicated by the arrow Q14, the traverse direction is the horizontal direction in the figure while the depth direction is the vertical direction in the figure.

In example as indicated by the arrow Q14, on the substrate 101 of the figure, from the left side to the right direction, the second transfer electrode 103-2, the first transfer electrode 102-1 and the second transfer electrode 103-1 are insulated by the insulation film 105 and sequentially lined up.

In the portion opposing to the first transfer electrode 102 and the second transfer electrode 103 in the substrate 101, a charge transfer channel region (not illustrated) is provided in order to readout a signal charge which is accumulated in the light receiving 71, and to transfer the signal charge in the vertical direction up to the horizontal transfer unit 63.

The first light-shielding film 104-3 is formed directly on the upper surface of the first transfer electrode 102-1 in the figure. As for the first light-shielding film 104-3, the width is shorter by only 10 to 100 nm in the traverse direction (vertical direction) with respect to the first transfer electrode 102-1. Further, the second light-shielding film 106-1 is provided so as to be electrically connected on the upper surface of the first light-shielding film 104-3 in the figure.

In addition, in the figure of the first light-shielding film 103, the first light-shielding film 104 is provided on the upper side, in the figure of the first light-shielding film 104, on the upper side portion, a groove is provided in the second light-shielding film 106 such that the insulation film 105 is exposed. In other words, grooves provided between the second light-shielding film 106-1 and the second light-shielding film 106-3, and between the second light-shielding film 106-1 and the second light-shielding film 106-2 which are provided on the insulation film 105. Due to the grooves, the second light-shielding film 106-1 to the second light-shielding film 106-3 are electrically separated.

The solid-state imaging device 32 as illustrated in FIG. 3, a light-shielding film (the first light-shielding film 104 and the second light-shielding film 106) is formed by being divided into two layers at the first transfer electrode 102 which is provided in the vicinity of light sensing unit 71 configuring each pixel. The light-shielding film thereof functions not only as a light-shielding member but also as a signal line for applying a voltage.

By such a configuration, between the first transfer electrode 102 and the light-shielding film, providing the insulation film and the contact becomes unnecessary, and a site formed of the first transfer electrode 102 of the vertical transfer 72, the first light-shielding film 104 and the second light-shielding film 106 may be smaller. Therefore, each pixel, that is, the openings of light sensing unit 71 may be wider, and the light collection characteristics of the solid-state imaging device 32 may be enhanced.

In particular, in the solid-state imaging device 32, since the contact does not have to be provided, the height in the vertical direction to the substrate 101 in a portion in the vicinity of the light sensing unit 71 of the vertical transfer unit 72 (a portion of the first transfer electrode 102) may be lower, and the opening of the light sensing unit 71 may be wider.

Further, as indicated by the arrow Q13 of the FIG. 3, the width in the horizontal direction of second light-shielding film 106, that is, since the width of parallel direction for the mutually adjacent light sensing unit 71 and the first transfer electrode 102 is narrower than that in the horizontal direction of the first light-shielding film 104, the opening in the horizontal direction of the light sensing unit 71 may be further widened. In other words, since the position of the lateral side of the side in the vicinity of the light sensing unit 71 of the second light-shielding film 106 provided on the upper surface of the first light-shielding film 104 may be far from the light sensing unit 71, the opening of the light sensing unit 71 may be wider.

In addition, by forming the second light-shielding film 106 in the shape of side wall on the lateral side of the light sensing unit 71 of the first light-shielding film 104, the sensitivity characteristics may be ensured even for light having a higher incident angle.

Further, in the above, with respect to an example of making the opening wider by forming the light-shielding film to be divided into two layers, has been described, while the two layers are formed on the portion of the first transfer electrode 102 provided in the vicinity of the light sensing unit 71. However, the two layers of the light-shielding film may be formed with respect to the other electric member without being limited to the first transfer electrode 102. For example, an electric member which is necessary for driving the solid-state imaging device 32 may be preferred and electric components or the like with the voltage applied to drive the solid-state imaging device 32 may be preferred.

Next, the operation of solid-state imaging device 32 as illustrated in FIG. 3 will be described.

At the start of imaging of the image, the light sensing unit 71 photoelectrically converts the light incident from the subject, the obtained signal charge is accumulated as a result thereof. Further, the timing generator circuit 81 supplies the first transfer electrode 102 with a vertical transfer clock via the second light-shielding film 106 and the first light-shielding film 104, when voltage is applied, the signal charge accumulated in the light sensing unit 71 is readout to the charge transfer channel region.

In addition, thereafter, the timing generator circuit 81 appropriately supplies the first transfer electrode 102 with the vertical transfer clock via the second light-shielding film 106 and the first light-shielding film 104, when the voltage is applied, supplying the second transfer electrode 103 with the vertical transfer clock via the first light-shielding film 104, and the transfer of the signal charge is performed when the voltage is applied. In other words, the signal charge which is readout to the charge transfer channel region is transferred up to the horizontal transfer unit 63 in the vertical direction.

And, when a timing generator circuit 81 applies the horizontal transfer clock to the horizontal transfer unit 63, and the horizontal transfer unit 63 transfers the charge transferred from the charge transfer channel region of vertical transfer unit 72 in the horizontal direction. And, the charge transferred to the horizontal transfer unit 63 is converted into a voltage, the voltage signal obtained as a result is output from the output unit 64.

Description of Manufacturing Process

Figure 4:
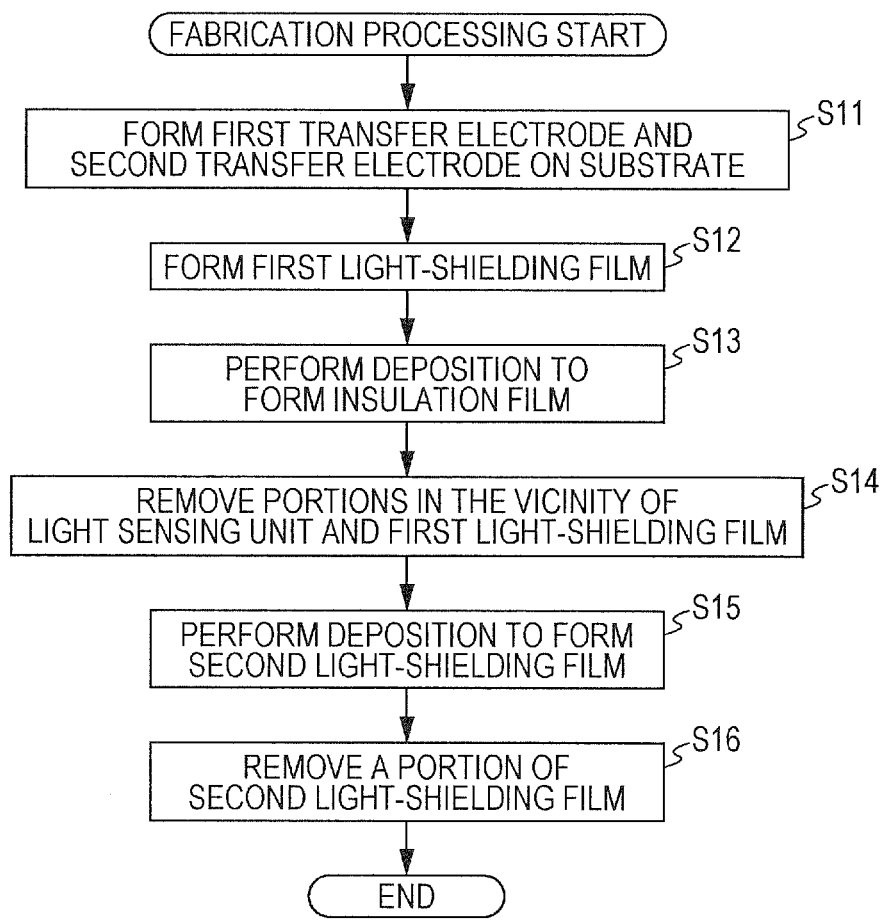
FIG. 4 is a flowchart describing a manufacturing process.
Figure 5:
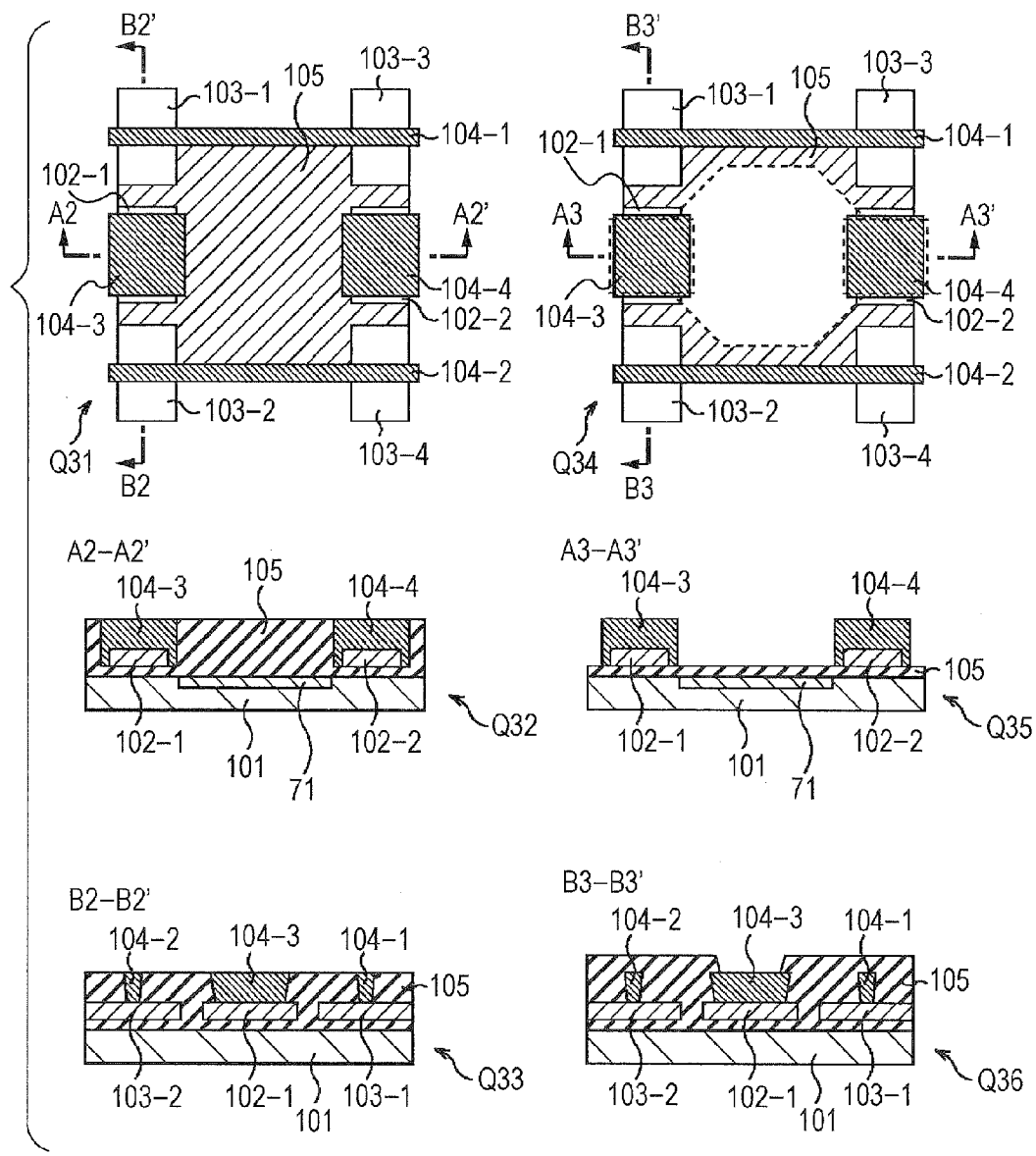
FIG. 5 is a diagram illustrating a manufacturing process of the solid-state imaging device.
Figure 6:
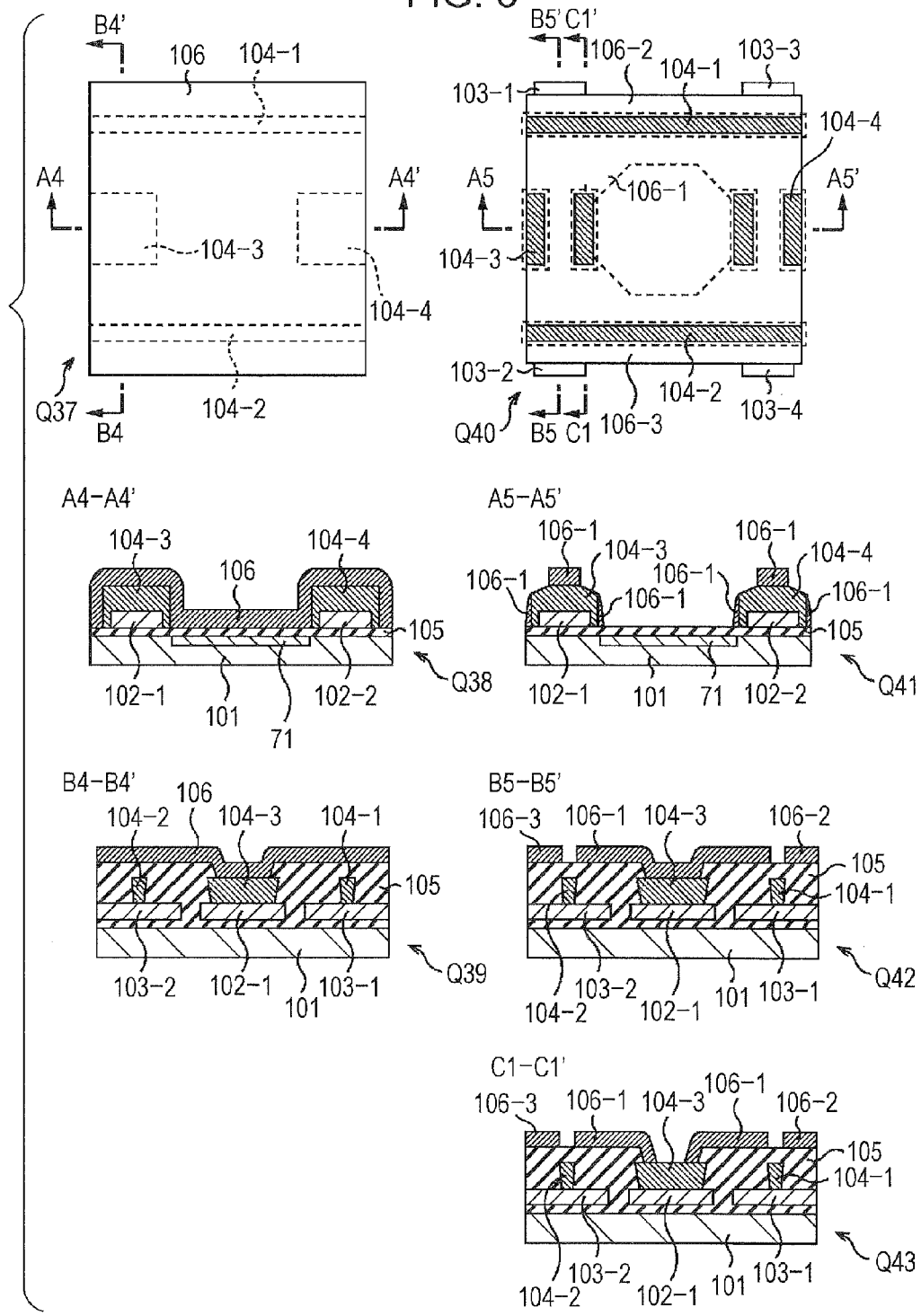
FIG. 6 is a diagram illustrating a manufacturing process of the solid-state imaging device.

The solid-state imaging device 32 described above is manufactured by the light shielding film being formed twice on the substrate 101. Hereinafter, the manufacturing process in which the solid-state imaging device 32 is manufactured will be described with the reference to FIG. 4 to FIG. 6. Further, FIG. 4 is a flowchart for describing the manufacturing process, FIG. 5 and FIG. 6 are diagrams illustrating the manufacturing process of the solid-state imaging device 32. In the FIG. 5 and the FIG. 6, the portions corresponding to the case in FIG. 3 are given the same symbols, and description thereof will be omitted appropriately.

In step S11, deposition is performed to form a film on the insulation film 105 which is on the substrate 101 and the first transfer electrode 102 and the second transfer electrode 103 are formed on the substrate 101. For example, the first transfer electrode 102 and the second transfer electrode 103 are formed from polysilicon. And the insulation film 105 is further formed on the substrate 101 where the first transfer electrode 102 and the second transfer electrode 103 are provided.

In step 12, the first light-shielding film 104 is formed on the first transfer electrode 102 and the second transfer electrode 103.

Specifically, first, the insulation film 105 is placed on the first transfer electrode 102 and the second transfer electrode 103 which have been arranged on the substrate 101. And, the insulation film 105 is removed by dry-etching according to the shape of desired electrode. In other words, the insulation layer 105 of a portion in the vicinity of the first transfer electrode 102 and second transfer electrode 103 is removed, so that the first light-shielding film 104-3 and the first light-shielding film 104-2 may be embedded in the portion thereof.

Then, a light-shielding material such as the first light-shielding film 104 is deposited to form a film, then dry-etching or CMP (Chemical Mechanical Polishing) is performed on the obtained light-shielding film, so that the first light-shielding film 104 is formed to be embedded in the portion which is in the vicinity of the first transfer electrode 102 or the second transfer electrode 103 of the insulation film 105.

Therefore, as indicated by the arrow Q31 in FIG. 5, the first light-shielding film 104-3 and the first light-shielding film 104-4 are respectively formed on the first transfer electrode 102-1 and the first transfer electrode 102-2 which are provided on the substrate 101. Further, the first light-shielding film 104-1 is formed on the second transfer electrode 103-1 and the second transfer electrode 103-3, and the first light-shielding film 104-2 is also formed on the second transfer electrode 103-2 and the second transfer electrode 103-4.

Further, in the solid-state imaging device 32 indicated by the arrow Q31, the longitudinal direction and the traverse direction respectively indicate the vertical direction and the horizontal direction in the figure.

In this example, the insulation film 105 is in a state to also be provided in opening portion of the light sensing unit 71 which is placed on the center of the substrate 101. Further, in the solid-state imaging device 32 indicated by the arrow Q31, the cross-section of the center portion, that is, in the cross-section of A2-A2', for example, to cover the first transfer electrode 102, the first light-shielding film 104 is embedded in the insulation film 105 as indicated by the arrow Q32.

Further, in the cross-sectional view as indicated by the arrow Q32, the traverse direction is the horizontal direction in the figure while the depth direction is the horizontal direction in the figure. Here, the surface of the first transfer electrode 102 opposing the substrate 101 is positioned on the same plane with the surface of the first light-shielding film 104 opposing to the substrate 101, and the surfaces thereof are in parallel with the surface of substrate 101, that is, the process is performed to make a uniform distance from the surfaces thereof to the surface of the substrate 101.

Further, the first light-shielding film 104 is formed where the width thereof in the horizontal direction is wider by only 10 to 100 nm at one side with respect to the first transfer electrode 102, therefore, the light shielding effect with respect to vertical transfer unit 72 is ensured. Further, in order to also ensure a contact performance between the first light-shielding film 104 and the first transfer electrode 102 when the first light-shielding film 104 is formed, a barrier metal such as Ti, TiN may be deposited to form a film between the first light-shielding film 104 and the first transfer electrode 102.

Further, in the cross-section of the vertical transfer unit 72 of the solid-state imaging device 32 as indicated by the arrow Q31, that is, the cross-section of B2-B2', as indicated by the arrow Q33, the first light-shielding film 104 is formed on the upper side of the first transfer electrode 102 and the second transfer electrode 103 in the figure. Also in the B2-B2', the first light-shielding film 104 is in a state of being embedded in the insulation film 105.

Returning to the description of the flowchart in FIG. 4, in step S13, in order to cover the first light-shielding film 104 formed in the process of step S12, the insulation film 105 is further deposited by such as an $SiO_2$ to form a film.

And, in step S14, the portion which is in the vicinity of the light sensing unit 71 on the substrate 101, that is, the opening portion of a pixel (light sensing unit 71) and the insulation film 105 of the portion of the first light-shielding film 104 are removed by lithography and dry-etching.

Therefore, for example, in the solid-state imaging device 32 indicated by the arrow Q34 in FIG. 5, the insulation film 105 in the region enclosed by the dotted line is removed. Further, in the solid-state imaging device 32 indicated by the arrow Q34, the longitudinal direction and the traverse direction respectively indicate the vertical direction and the horizontal direction.

In this example, out of the insulation film 105 which is deposited to form the film in order to cover the first light-shielding film 104, the part immediately above the light-shielding film 71 and the top portion of the first light-shielding film 104-3 and the first light-shielding film 104-4 (surface which is opposite the surface of the substrate 101) is removed.

Therefore, the cross-section of the central portion in the solid-state imaging device 32, that is, the cross-section of A3-A3' is in a state without the insulation film 105 on the surface of the first light-shielding film 104 and between the first light-shielding film 104-3 and the first light-shielding 104-4 which is in the vicinity of light sensing unit 71 as indicated by the arrow Q35.

Further, the cross-section of the vertical transfer unit 72 in the solid-state imaging device 32 as indicated by the arrow Q34, that is, the cross-section of B3-B3', in the figure of the first light-shielding film 104-3 as indicated by the arrow Q36, a portion of upper surface is in a state without the insulation film 105. On the other hand, in the figure of the first light-shielding film 104-1 and the first light-shielding film 104-2, the upper surface thereof is in a state of being covered by the insulation film 105.

Returning to the description of the flowchart of FIG. 4, in the step S15, in order to cover the portion of insulation film 105 on the substrate 101 and the portion of the first light-shielding film 104 with the insulation film 105 removed, the second light-shielding film 106 is deposited to form the film.

Therefore, for example, as indicated by the arrow Q37 in FIG. 6, the first light-shielding film 104 and the insulation film 105 provided on the substrate 101 are totally covered by the second light-shielding film 106. Further, in the solid-state imaging device 32 indicated by the arrow Q37, the longitudinal direction and the traverse direction in the figure respectively indicate the vertical direction and the horizontal direction.

In the cross-section of the central portion in the solid-state imaging device 32 indicated by the arrow Q37, that is, in the cross-section of A4-A4', as indicated by the arrow Q38, the surface of the first light-shielding film 104 and the portion in the vicinity of light sensing unit 71 of the insulation film 105 deposited to form a film on the substrate 101 is covered with the second light-shielding film 106.

Further, the cross-section of the vertical transfer unit 72 of the solid-state imaging device 32 indicated by the arrow Q37, that is, B4-B4' cross-section, as indicated by the arrow Q39, the exposed portion on the upper side of the first light-shielding film 104-3 in the figure and the portion of insulation film 105 are covered with the second light-shielding film 106.

By depositing the second light-shielding film 106 to form the film in this manner, the first light-shielding film 104 and the second light-shielding film 106 are electrically connected to each other on the first transfer electrode 102. That is, if a voltage is applied to the second light-shielding film 106, the voltage is also applied to the first transfer electrode 102 via the second light-shielding film 106 and the first light-shielding film 104.

Further, as indicated by the arrow Q39, even if the film is formed on the second light-shielding film 106 by deposition, the insulation is in a state of being insulated by the first light-shielding film 104-1, the first light-shielding film 104-2, the second light-shielding film 106 and the insulation film 105 provided therebetween.

Returning to the description of the flowchart in FIG. 4, in the step S16, the portion of second light-shielding film 106 which is deposited to form the film at the process of step S15 is removed by lithography and dry-etching, and is finally solid-state imaging device 32.

For example, as indicated by the arrow Q40 of FIG. 6, the second light-shielding film 106 which is placed in a region enclosed by a dotted line of the solid-state imaging device 32 is removed. Further, in the solid-state imaging device 32 indicated by the arrow Q40, the longitudinal direction and the traverse direction respectively indicate the vertical direction and the horizontal direction in the figure.

In this example, in the second light-shielding film 106, the portion immediately above the light sensing unit 71, the portion immediately above the first light-shielding film 104-1 and the first light-shielding film 104-2, and the end portion of upper side of the first light-shielding film 104-3 and the first light-shielding film 104-4 are removed.

Therefore, in the cross-section of the central portion shown in the solid-state imaging device 32 indicated by the arrow Q40, that is, in cross-section A5-A5' as indicated by the arrow Q41, the portion in the second light-shielding film 106 formed on the surface of the first light-shielding film 104 covering the first transfer electrode 102 and the second light-shielding film 106 in the vicinity of the light sensing unit 71 are removed.

In this example, since the second light-shielding film 106 is formed with a narrow line width than the first light-shielding film 104 in the horizontal direction, the opening of the light sensing unit 71 becomes wider. Further, the second light-shielding film 106 is formed in the shape of a sidewall on the side of the first light-shielding film 104, the shielding performance is in a state of being enhanced.

Further, in the cross-section of the central portion of the vertical transfer portion 72 of the solid-state imaging device 32 as indicated by the arrow Q40, that is, in cross-section B5-B5', the portion (gap) between the first transfer electrode 102 and the second transfer electrode 103, or the first light-shielding film 104-3 is covered by the second light-shielding film 106-1 as indicated by the arrow Q42. Therefore, there may be no case which the unnecessary light is incident on the gap.

Similarly, the cross-section of the central portion of the vertical transfer portion 72 of the solid-state imaging device 32 as indicated by the arrow Q40, that is, in cross-section C1-C1', the gap between the first transfer electrode 102 and the second transfer electrode 103 and a portion of the first light-shielding film 104-3 are covered by the second light-shielding film 106-1 as indicated by the arrow Q43. Therefore, also in a case as indicated by the arrow Q43, there is no case which unnecessary light is incident on the gap, so that the light shielding effect may be improved.

As described above, when the portion of the second light-shielding film 106 is removed, and a final solid-state imaging device 32 is obtained, the manufacturing process will be completed.

When the solid-state imaging device 32 is manufactured, the first light-shielding film 104 is formed with respect to the first transfer electrode 102 and the second transfer electrode 103, the second light-shielding film 106 is formed on the first light-shielding film 104 or the like and the second light-shielding film 106 is appropriately processed to make a final solid-state imaging device 32.

Therefore, since the light-shielding film formed on the first electrode 102 also functions as signal line and is divided into the first light-shielding film 104 and the second light-shielding film 106, that is, by forming through dividing twice, the solid-state imaging device 32 having high opening pixel may be obtained more easily.

Further, the solid-state imaging device 32 is not limited to the CCD sensor, and may be any other form of sensor, such as a CMOS (Complementary Metal Oxide Semiconductor) sensor.

Further, the embodiment of the present technology is not limited to the above-described embodiment and various modifications may be made without departing from the sprit and scope of the present technology.

Further, the present technology may be also formed in the following configuration.

[1] There is provided a solid-state imaging device including a light sensing unit which generates a signal charge by performing a photoelectric conversion of an incident light, a conductive material in the vicinity of the light sensing unit, a first light-shielding film formed to cover at least a portion of the conductive material, a second light-shielding film formed on a part of or all of the surface of the first light-shielding film.

[2] The solid-sated imaging device according to [1], the first light-shielding film and the second light-shielding film are formed of a member having conductivity, and a voltage may be applied to the conductive material via the first light-shielding film and the second light-shielding film when the solid-state imaging device is driven.

[3] The solid-state imaging device according to [2], the conductive material is a transfer electrode to which the voltage is applied when the signal charge accumulated in the light sensing unit is readout.

[4] The solid-state imaging device according to any one of [1] to [3], the width in the direction of being lined up between the conductive material and the first light sensing unit which is in the vicinity of the conductive material, the second light-shielding film is formed to be narrower than the width of direction of the first light-shielding film.

[5] The solid-state imaging device according to any one of [1] to [4], the second light-shielding film is formed in the shape of a sidewall on the side of the light sensing unit side of the first light-shielding film.

[6] The solid-state imaging device according to any one of [1] to [5], the conductive material is formed from polysilicon and the first light-shielding film and the second light-shielding film are formed from tungsten.

The present disclosure contains subject matter related to that disclosed in Japanese Priority Patent Application JP 2011-222743 filed in the Japan Patent Office on Oct. 7, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a light sensing unit generating a signal charge by performing a photoelectric conversion of an incident light;
   a conductive material in the vicinity of the light sensing unit;
   a first light-shielding film formed to cover at least a portion of the conductive material; and
   a second light-shielding film formed on a part of or all of a surface of the first light-shielding film and in electrical contact with the first light-shielding film.

2. The solid-state imaging device according to claim 1, wherein the first light-shielding film and the second light-shielding film are formed of a member having conductivity, and
   a voltage is applied to the conductive material via the first light-shielding film and the second light-shielding film when the solid-state imaging device is driven.

3. The solid-state imaging device according to claim 2, wherein the conductive material is a transfer electrode to which the voltage is applied when the signal charge accumulated in the light sensing unit is readout.

4. The solid-state imaging device according to claim 3, wherein the second light-shielding film is formed such that the width in the direction of being lined up between the conductive material and the first light sensing unit which is in the vicinity of the conductive material is narrower than the width of the direction of the first light-shielding film.

5. The solid-state imaging device according to claim 4, wherein the second light-shielding film is formed in the shape of a sidewall on the side of the light sensing unit side of the first light-shielding film.

6. The solid-state imaging device according to claim 1, wherein the conductive material is formed from polysilicon and the first light-shielding film and the second light-shielding film are formed from tungsten.

7. The solid-state imaging device according to claim 1, wherein the first light-shielding film is formed directly on the surface of the conductive material.

8. The solid-state imaging device according to claim 1, wherein the second-light shielding film is formed directly on the surface of the first light-shielding film.

9. A manufacturing method of solid-state imaging device comprising:
   forming a first light-shielding film covering at least a portion of conductive material arranged in the vicinity of light sensing unit which generates a signal charge by performing photoelectric conversion on the incident light; and
   forming a second light-shielding film on a part of or all of a surface of the first light-shielding film and in electrical contact with the first light-shielding film.

10. The manufacturing method according to claim 9, wherein the first light-shielding film and the second light-shielding film are formed of a member having conductivity, and
    a voltage is applied to the conductive material via the first light-shielding film and the second light-shielding film when the solid-state imaging device is driven.

11. The manufacturing method according to claim 10, wherein the conductive material is a transfer electrode to which the voltage is applied when the signal charge accumulated in the light sensing unit is readout.

12. The manufacturing method according to claim 11, wherein the second light-shielding film is formed such that the width in the direction of being lined up between the conductive material and the first light sensing unit which is in the vicinity of the conductive material is narrower than the width of the direction of the first light-shielding film.

13. The manufacturing method according to claim 12, wherein the second light-shielding film is formed in the shape of a sidewall on the side of the light sensing unit side of the first light-shielding film.

14. The manufacturing method according to claim 9, wherein the conductive material is formed from polysilicon and the first light-shielding film and the second light-shielding film are formed from tungsten.

15. The manufacturing method according to claim 9, wherein the first light-shielding film is formed directly on the surface of the conductive material.

16. The manufacturing method according to claim 9, wherein the second light-shielding film is formed directly on the surface of the first light-shielding material.

17. An imaging unit comprising:
    a light sensing unit generating a signal charge by performing photoelectric conversion on the incident light from a subject;
    an optical system guiding light from the subject to the light sensing unit;
    a conductive material in the vicinity of the light sensing unit;
    a first light-shielding film formed to cover at least a portion of the conductive material; and
    a second light-shielding film formed on a part of or all of a surface of the first light-shielding film and in electrical contact with the first light-shielding film.

18. The imaging unit according to claim 17, wherein the first light-shielding film and the second light-shielding film are formed of a member having conductivity, and
    a voltage is applied to the conductive material via the first light-shielding film and the second light-shielding film when the solid-state imaging device is driven.

19. The imaging unit according to claim 17, wherein the first light-shielding film is formed directly on the surface of the conductive material.

20. The imaging unit according to claim 17, wherein the second light-shielding film is formed directly on the surface of the first light-shielding material.

* * * * *